US006782107B1

United States Patent
Gleim

(10) Patent No.: US 6,782,107 B1
(45) Date of Patent: Aug. 24, 2004

(54) METHOD AND ARRANGEMENT FOR AUTOMATICALLY CONTROLLING THE VOLUME IN AN AUDIO SIGNAL REPRODUCTION DEVICE

(75) Inventor: Peter Gleim, Diekholzen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/402,418

(22) PCT Filed: Feb. 5, 1998

(86) PCT No.: PCT/DE98/00315

§ 371 (c)(1),
(2), (4) Date: Oct. 4, 1999

(87) PCT Pub. No.: WO98/45940

PCT Pub. Date: Oct. 15, 1998

(30) Foreign Application Priority Data

Apr. 4, 1997  (DE) .......................... 197 13 862

(51) Int. Cl.[7] .......................... H03G 3/00; H03F 21/00; H03F 3/217; H03F 3/18; H04R 29/00
(52) U.S. Cl. .......................... 381/104; 381/58; 381/120; 381/107; 330/207 A; 330/251; 330/263
(58) Field of Search .......................... 381/104–108, 381/120, 58, 59; 330/207 A, 207 P, 10, 251, 263, 298; 700/94

(56) References Cited

U.S. PATENT DOCUMENTS

| | | | |
|---|---|---|---|
| 3,990,019 A | * 11/1976 | Crockett et al. | 330/207 P |
| 4,398,061 A | * 8/1983 | McMann, Jr. | 381/94.8 |
| 4,464,634 A | * 8/1984 | Velazquez | 330/264 |
| 5,453,716 A | * 9/1995 | Person et al. | 330/2 |
| 5,633,939 A | * 5/1997 | Kitani et al. | 381/106 |
| 5,672,999 A | * 9/1997 | Ferrer et al. | 330/138 |
| 5,796,852 A | * 8/1998 | Yamaguchi | 381/104 |
| 5,949,887 A | * 9/1999 | Fado et al. | 381/58 |
| 6,170,024 B1 | * 1/2001 | Wakeland et al. | 710/38 |
| 6,404,891 B1 | * 6/2002 | Seitz et al. | 381/107 |
| 6,473,662 B2 | * 10/2002 | Lubbe et al. | 700/94 |

FOREIGN PATENT DOCUMENTS

| | | |
|---|---|---|
| AT | 397 894 | 7/1994 |
| EP | 0 609 665 | 8/1994 |
| JP | 06 284006 | 10/1994 |

OTHER PUBLICATIONS

Program 96/97, Robert Bosch GmbH.**
Program 96/97, Mobile Kommunikation von Blaupukt, Blaupunkt, Bosch Gruppe, 1996.*

* cited by examiner

Primary Examiner—Minsun Oh Harvey
Assistant Examiner—Laura A. Grier
(74) Attorney, Agent, or Firm—Kenyon & Kenyon

(57) ABSTRACT

An arrangement and a method for automatically controlling the volume in an audio signal reproduction device. A digital signal processing circuit, which is arranged in the audio signal path for influencing the audio signal anyway, is used to reduce the reproduction volume in the event of an overdrive condition of the power amplifier. The overdrive condition is indicated by an overdrive signal attained by the power amplifier. In the process, the decrease and increase in the volume is carried out using various time constants, and disturbing control oscillations are neutralized by inserting a counter which must be decremented prior to a raising of the volume.

9 Claims, 4 Drawing Sheets

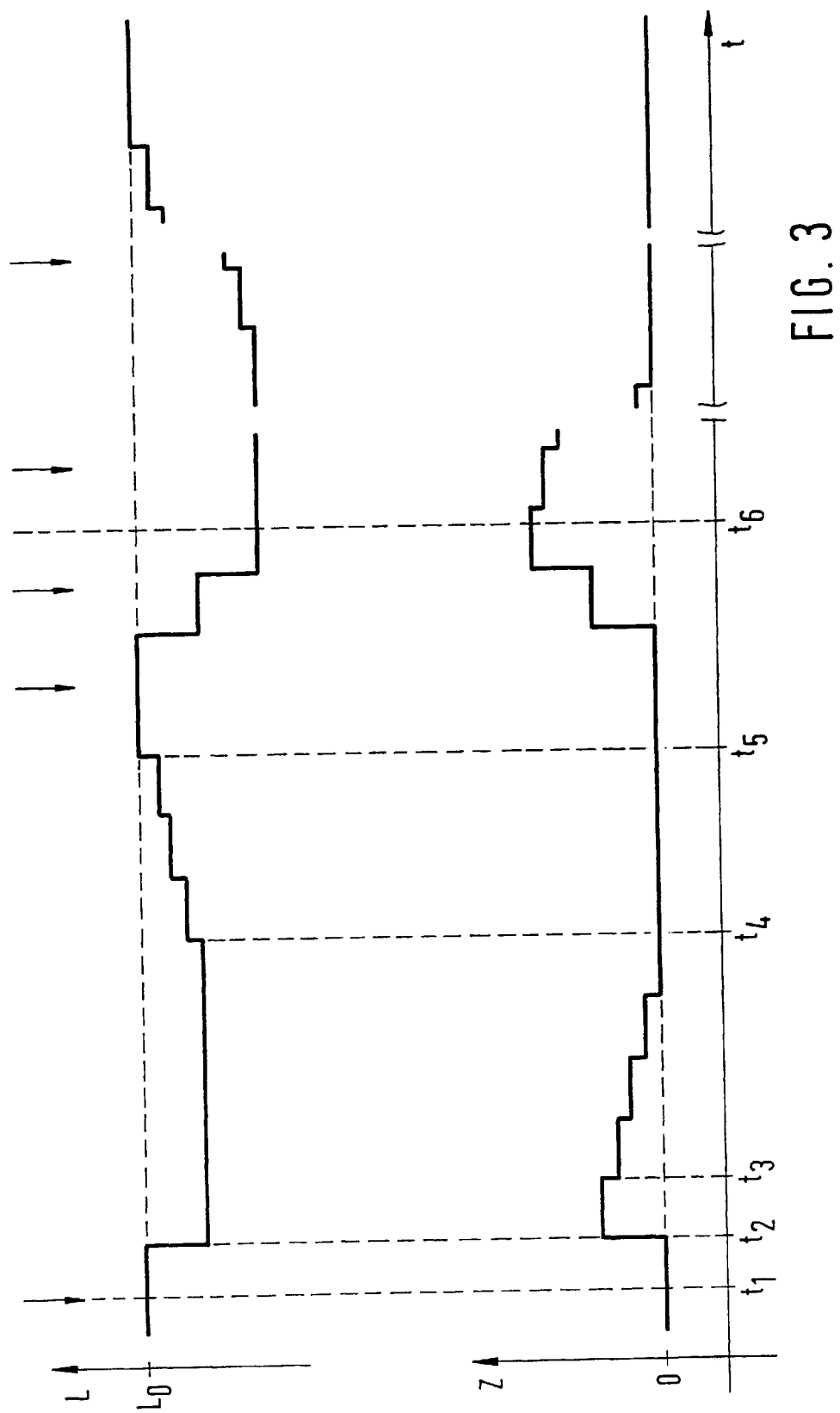

METHOD AND ARRANGEMENT FOR AUTOMATICALLY CONTROLLING THE VOLUME IN AN AUDIO SIGNAL REPRODUCTION DEVICE

FIELD OF THE INVENTION

The present invention is based on a method and an arrangement for automatically controling the volume in an audio signal reproduction device.

BACKGROUND INFORMATION

Conventional radio receivers provide power amplifiers for amplifying an audio signal to be reproduce. The power amplifiers have an output where, in the event that a power amplifier is overdriven, a signal indicating an overdrive is present.

In prospectus "Programm 96/97" of Robert Bosch GmbH car radios Berlin RCM 303 A and Atlanta RD 105 are described in which signal processing circuits in the form of digital signal processors (DSP) for automatic, disturbance-dependent volume control of the audio signals to be reproduced are provided. The reproduction volume of the audio signal is raised in a frequency-selective manner as a function of the intensity and the spectral distribution of the disturbing noise.

SUMMARY OF THE INVENTION

The arrangement according to the present invention has the advantage that the digital signal processor, which already exists in conventional radio receivers can also be used to prevent the power amplifier from being overdriven in addition to automatic volume control. In this manner, a separate microprocessor as well as a special electronically controllable volume control of the conventional radio receivers become dispensable. Moreover, the speed of response to an overdrive condition of the power amplifier increases considerably; in first tests a reduction of the response time by the factor 100 was achieved so that an overdrive condition is virtually inaudible.

In addition, the arrangement according to the present invention has the advantage that by selecting the values differently in the case of lowering and increasing the reproduction volume, as well as by delaying the increase of the reproduction volume after lowering the reproduction volume with the assistance of an inserted counter, control oscillations of the volume are no longer audible.

Furthermore, it is advantageous that, after a deactivation of the automatic volume control, the lowered reproduction volume is not raised to the originally preset value abruptly, but gradually using the time constant predefined by the method according to the present invention.

In the course of various measurements, it was ascertained that, in the event of overdrives conditions of the power amplifier, the lower-frequency portions of the audio signal cause these overdrive conditions in the majority of cases. Therefore, it is advantageous not to damp the entire audio signal in the event of an overdrive conditions but only the low-frequency portions of the audio signal are responsible for the overdrive, since such a frequency-selective volume lowering is less conspicuous than lowering the entire audio signal range.

Finally, it is regarded as advantageous to adapt the dynamic response of the volume control to the dynamics of the signal source or type of signal by selecting the volume and counter increments and decrements accordingly. Thus, for example, the audio signal played back from a compact disc (CD) has a considerably higher dynamic range than, for example, an audio signal emitted by a radio receiver.

BRIEF DESCRIPTION OF THE DRAWINGS

FIG. 3 illustrates an embodiment of time sequences during an automatic control of a reproduction volume.

DETAILED DESCRIPTION

Figure 1:
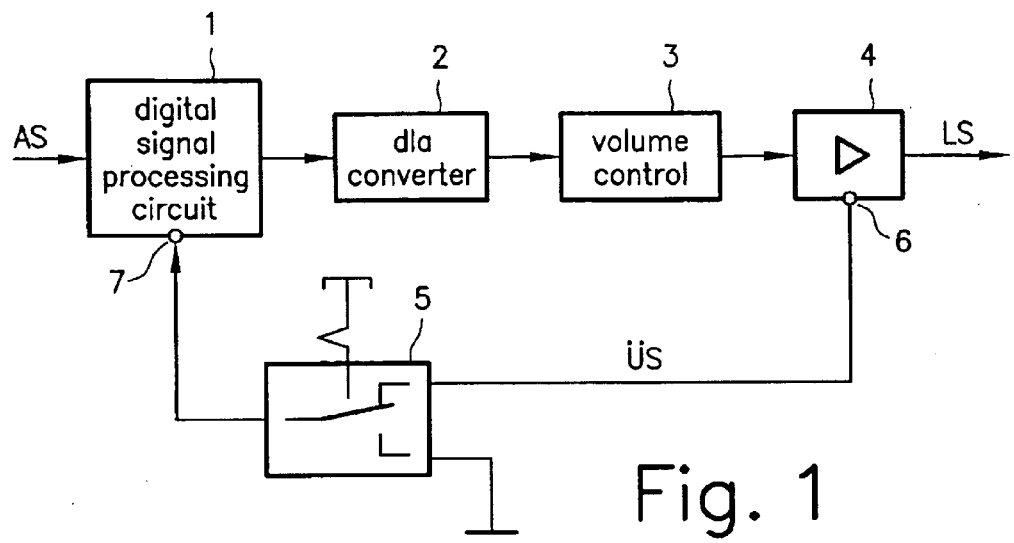
FIG. 1 illustrates a block diagram of a portion of an audio signal reproduction device for monophonic audio signals according the present invention.

FIG. 1 shows a block diagram of the portion of an audio signal reproduction device according to the present invention for monophonic reproduction which is essential to the present invention.

The audio signal AS to be reproduced exists in digital form and, is fed to a signal processing circuit 1 in the form of a digital signal processor DSP for influencing the reproduction signal. The digital output signal of digital signal processing circuit 1 is fed, via a digital-to-analog converter 2, to a volume control 3 for manually presetting the reproduction volume of the audio signal to be reproduced. The output of volume control 3 is connected to a power amplifier 4 for amplifying the reproduction signal. An unshown loudspeaker is connected to power amplifier 4 for reproducing the amplified audio signal LS.

Power amplifier 4 has an output 6 at which, in the event that power amplifier 4 is overdriven, a signal ÜS indicating an overdrive is present. This overdrive condition output 6 of power amplifier 4 is fed to a control input 7 of the digital signal processing circuit via a manually operable switch 5. In a first position of switch 5, overdrive output 6 of power amplifier 4 is connected to control input 7 of digital signal processing circuit 1. In the second position of switch 5, the signal path is interrupted, and the control input of digital signal processing circuit 1 is connected to a reference potential.

By shifting switch 5 from the first to the second position, it is possible to deactivate the automatic control of the reproduction volume which is described in greater detail in the following. Instead of using switch 5 for switching the automatic control on and off, it is also conceivable, by actuating a corresponding key at a control unit of the reproduction device, to set a register whose state indicates the activation or deactivation of the control algorithm.

Figure 1A:
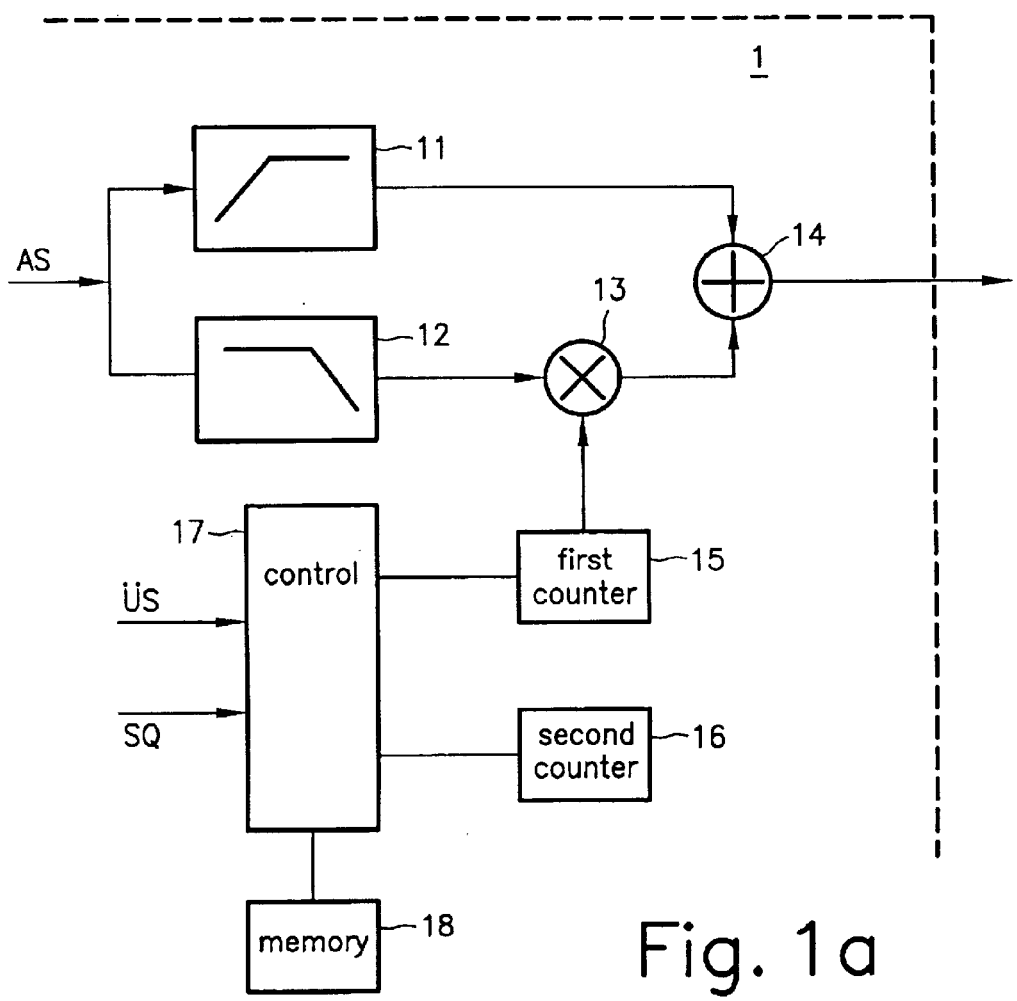
FIG. 1*a* illustrates an exemplary embodiment of a circuit for influencing the reproduction volume implemented in the digital signal processing circuit of FIG. 1.

FIG. 1*a* shows a block diagram of a preferred embodiment of the part of digital signal processing circuit 1 that is essential to the present invention.

The audio signal AS, which exists in digital form, is fed to both a high pass filter 11 and low pass filter 12, the edge steepness and critical frequency of both filters ideally coinciding. The Or output signal of low pass filter 12 is fed to the first input of a multiplier 13 for evaluation with the assistance of a factor provided by a first counter 15, and fed to the second input of multiplier 13. The outputs of high pass filter 11 and multiplier 13 are connected to the two inputs of an adder 14 to form the audio signal to be reproduced, which is fed to digital-to-analog converter 2.

First counter 15, which provides a factor for lowering the reproduction volume is connected as a second counter 16, to a control 17. The control 17 implements the control program shown in FIG. 2 the mode of operation of the control 17, in conjunction with the description of the mode of operation of the method according to the patent invention, is describe in greater detail in the following. Moreover, control 17 is connected to a memory 18, in which various sets of pre-defined values are stored that are read out and fed to counters 15, 16 as a function of a signal SQ indicating the selected signal source.

Figure 2:
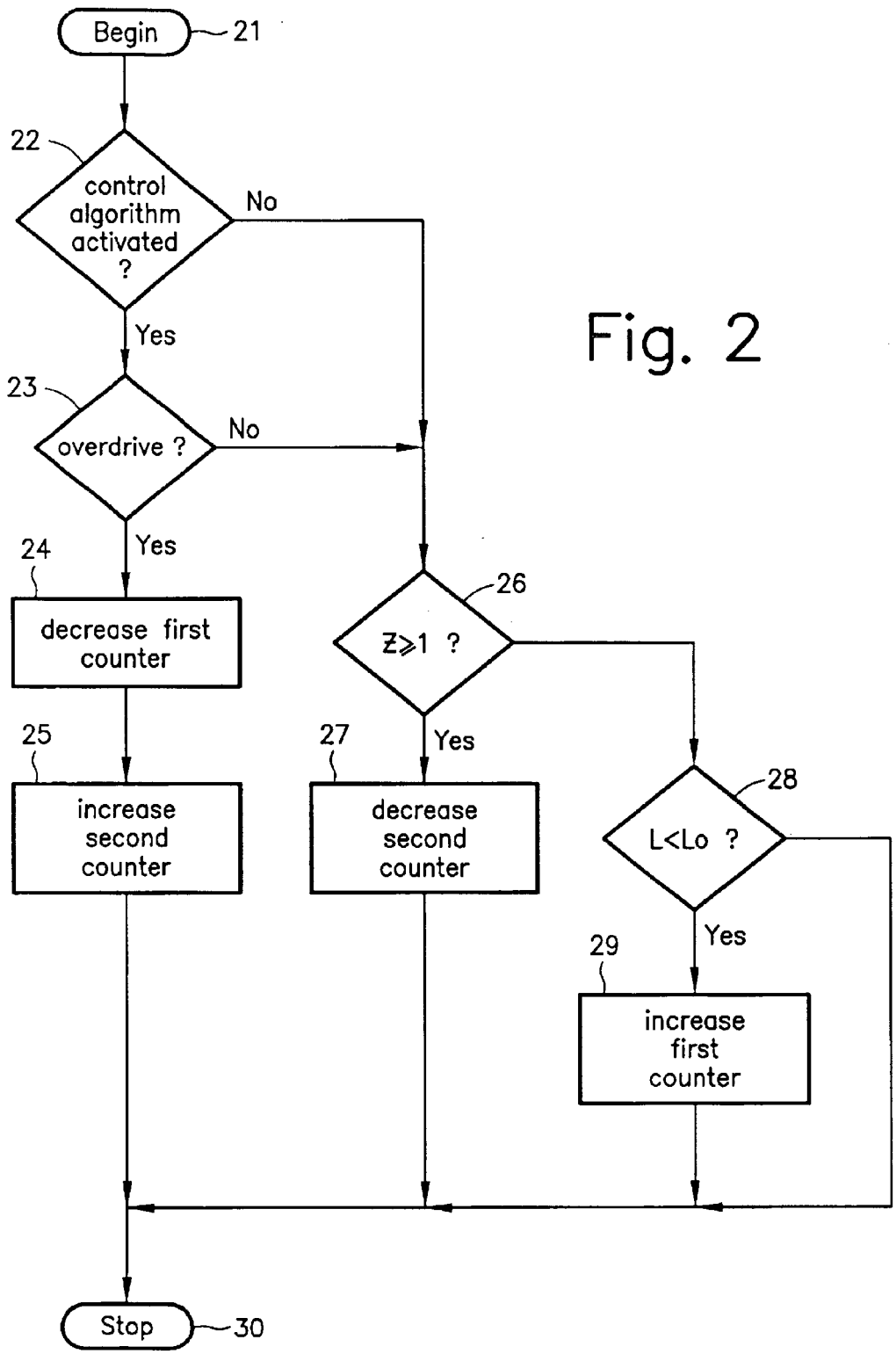
FIG. 2 illustrates a flow chart of a control program implemented in the digital signal processing circuit.

By splitting the audio signal to be reproduced into a high-frequency and a low-frequency portion and selectively influencing the low-frequency portion, the volume control according to the present invention has an effect only on the low-frequency portion of the audio signal to be reproduced. The sequence shown in FIG. 2 is executed for each sampling value of the audio signal, which exists in digital form, and is fed to digital signal processing circuit 1. The sequence begins with step 21. At 22, it is queried whether the control algorithm is activated, i.e., whether a corresponding register is set in the digital signal processing circuit. In the case of the exemplary embodiment shown in FIG. 1, where the algorithm is deactivated by shifting switch 5 into its second position, this first query 22 is unnecessary.

If the control algorithm is activated, control input 7 of digital signal processing circuit 1, which is connected to overdrive output 6 of power amplifier 4, is checked for the, presence of a signal indicating an overdrive condition. If an overdrive, condition occurred during the last sampling value of the digital signal, or if this occurs during query 23, then the counter content of a first counter 15, and, consequently, volume L of the audio signal to be reproduced, which is multiplied with the counter content of first counter 15, is lowered by last predefined value of the order of magnitude of, in the present case, $\frac{1}{1000}$ of the maximum value 1 (step 24). At the same time, counter content Z of a second counter 16, starting from the value 0, is increased by a second predefined value, in the present case, by 1 (step 25). Subsequently, the sequence is completed at 30.

In the case that, by resetting the corresponding register in digital signal processing circuit 1, or, as shown in FIG. 1, by actuating switch 5 into its second position, the control algorithm is deactivated, or, as queried at 23, no overdrive condition of power amplifier 4 has occurred, counter content Z of second counter 16 is queried at 24. If this is not equal to zero, therefore greater than 1, then, at 27, counter content Z of second counter 16 is decremented by a third predefined value which, in the present case, is selected on the order of $\frac{1}{10}$ of the second predefined value, and the sequence is completed at 30.

If counter content Z of second counter 16 is 0, then, at 28, it is checked whether reproduction volume L is reduced compared to the preset value $L_0$, i.e., the counter content of first counter 15 is smaller than 1. If this is the case, then the counter content of first counter 15, and, consequently, reproduction volume L, is raised by a fourth predefined value (step 29), and the procedure is completed. In the case that volume L is not reduced, the sequence is completed at 30 without further action.

In FIG. 3, the sequence of the method according to the present invention at the mode of operation of the arrangement according to the present invention are elucidated again on the basis of the time characteristic of reproduction volume L and counter content Z of second counter 16.

Initially, the reproduction volume is at the value $L_0$ preset via volume control 3, and the counter content of second counter 16 is 0. Switch 5 is in its first position, i.e., the control algorithm is activated.

Then, at instant $t_1$, an overdrive condition of power amplifier 4 occurs, which is represented as an arrow at the top edge of the picture. At the beginning of the next sampling value of the audio signal, i.e., in the present example, at instant $t_2$, the sequence is started in accordance with FIG. 2. Since, as is queried at 22, the control algorithm is active, the reproduction volume of the audio signal, because of an overdrive conditions of power amplifier 4, is reduced by the first predefined value at 24, and second counter 16 is increased by the second predefined value at the same time. At instant $t_3$, because of the absence of an overdrive of power amplifier 4, the second counter is decremented by the third predefined value, which, for the present example, was selected to be $\frac{1}{4}$ of the second predefined value. Because of the absence of a further overdrive, this operation is repeated until second counter 16 has reached the value 0.

At instant $t_4$, since the counter content of the second counter is 0 and further overdrive condition is not present, the reproduction volume is increased by the fourth predefined value, which, in the present example, is selected to be $\frac{1}{4}$ of the first predefined value. In the absence of further overdrives conditions, the volume is increased gradually until it has reached its original value $L_0$ at $t_5$.

At instant $t_6$, at which the control is switched off by actuating switch 5 into the second position, the volume is reduced because of two preceding overdrive conditions, and the counter content of second counter 16 is increased. In spite of further overdrive conditions, the counter content of second counter 16 is now decremented gradually to 0. Subsequently, the reproduction volume is raised gradually to the preset value $L_0$.

Figure 1B:
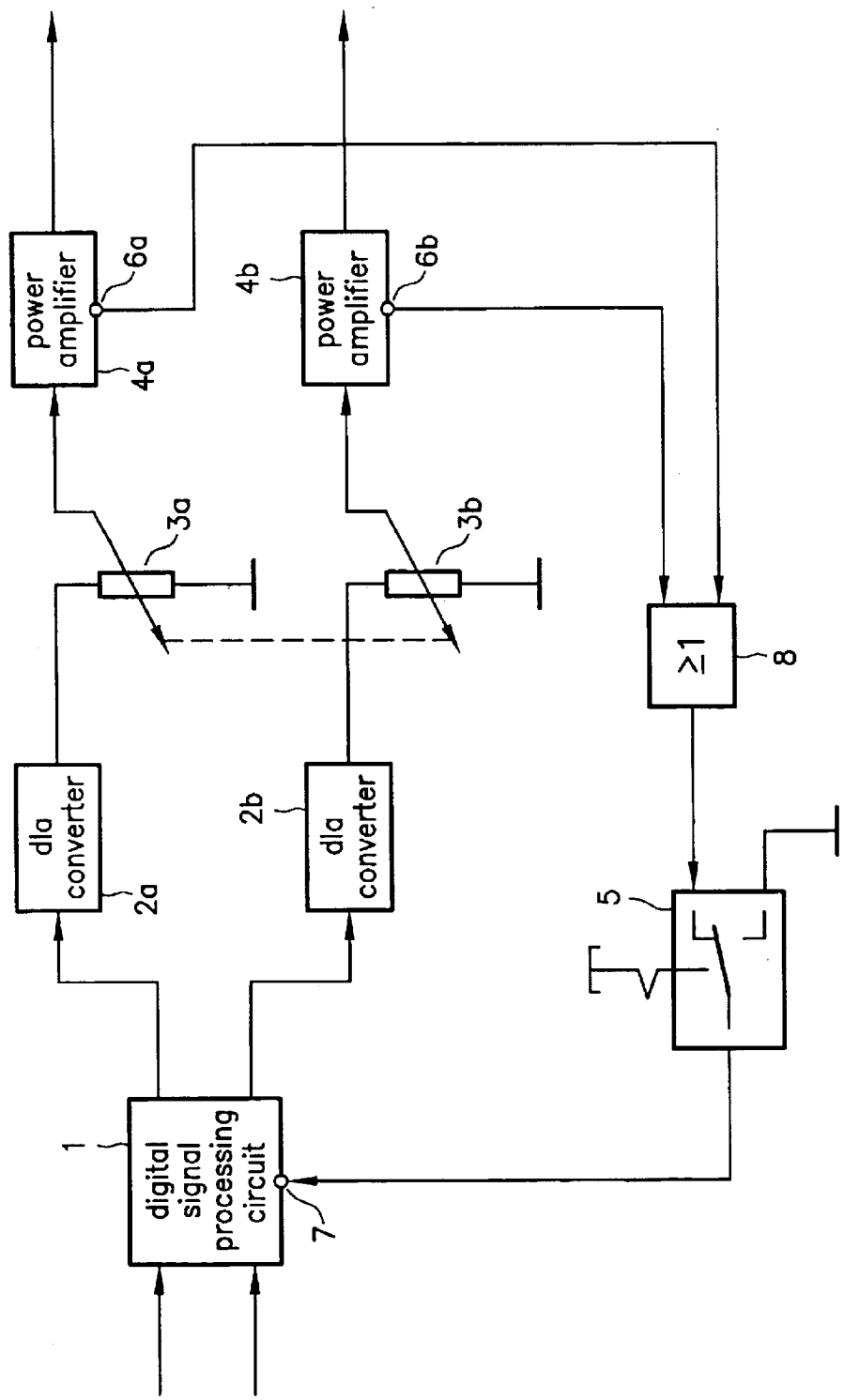
FIG. 1*b* illustrates an exemplary embodiment of an arrangement for reproducing stereophonic audio signals according to the present invention.

FIG. 1b shows a second exemplary embodiment of an arrangement for carrying out the method according to the present invention for the reproduction of stereophonic audio signals. This embodiment has two signal paths 2a to 4a and 2b to 4b for the signals of the left and the right audio channel. Volume controls 3a and 3b, which are actuated concurrently by a, for example, mechanical coupling, are designed in the form of potentiometers. The potentiometers are connected unilaterally to the reference potential and are connected to the outputs of digital-to-analog converters 2a and 2b, whose taps are fed to power amplifiers 4a and 4b.

In an OR element 8, the overdrive outputs of power amplifiers 4a and 4b are combined into a joint overdrive signal ÜS which is fed, via switch 5, to control input 7 of digital signal processing circuit 1 which, in the present case, includes an arrangement 11 through 14 for each of the two stereo channels, and a shared arrangement 15 through 18 for actuating arrangements 11 through 14.

In a further development of the method according to the present invention, allowance is made for selecting the magnitude of the predefined values as a function of the signal source, which provides the audio signal to be reproduced. Thus, for example, a higher control dynamic response, i.e., higher third and fourth predefined values, is selected for audio signals coming from a compact disc than for broadcast signals since the audio signals from CD have higher dynamics.

For that, a memory 18 with a plurality of sets of predefined values is connected to control 17, and a set of values assigned to a specific signal source is read out from memory 18. In the present case, this is implemented by addressing the memory with the assistance of the source selector switch, which is used to select the signal source connected to the reproduction device.

In a similar manner, different types of signals, for example, classical music or pop music, can be assigned different sets of predefined values. In the case of broadcast signals, it is possible to distinguish the type of signal, for example, by evaluating the program type identification (PTY), which is broadcast via the radio data system (RDS) and which indicates the program type currently being broadcast by a radio station.

What is claimed is:

1. A method for automatically controlling a volume in an audio signal reproduction device having at least one power amplifier for amplifying an audio signal to be reproduced, comprising the steps of:

generating an overdrive signal indicating an overdrive condition, using the at least one power amplifier;

in response to a presence of the overdrive signal, decreasing a reproduction volume of an audio signal by a first predefined value while simultaneously increasing a counter content of a counter by a second predefined value, the audio signal including sampling values;

in response to an absence of the overdrive signal, decreasing the counter content by a third predefined value when the counter content is greater than zero, and increasing the reproduction volume by a fourth predefined value when the counter content is equal to zero and the reproduction volume is less than a preset value; and repeating the previous steps for each sampling value of the audio signal, the audio signal being digital.

2. The method according to claim 1, further comprising the steps of:

when an automatic volume control is deactivated,
      decreasing the counter content by the third predefined value when the counter content is greater than zero;
      increasing the reproduction volume by the fourth predefined value when the counter content is equal to zero and the reproduction volume is less than a preset value; and
      repeating the previous steps for each sampling value of the audio signal.

3. The method according to claim 1, wherein the first predefined value is greater than the fourth predefined value, and the second predefined value is greater than the third predefined value.

4. The method according to claim 1, further comprising the step of:
   influencing the reproduction volume in a frequency-selective manner in a low-frequency audio signal range.

5. The method according to claim 1, further comprising the step of:
   selecting the predefined values from a set of predefined values, the step of selecting being performed as a function of at least one of a selected audio signal source and a type of the audio signal.

6. An arrangement for automatically controlling a volume in an audio signal reproduction device, comprising:

at least one power amplifier, the at least one power amplifier receiving an audio signal to be reproduced, the at least one power amplifier having an overdrive output for emitting an overdrive signal, the overdrive signal indicating an overdrive condition, the audio signal including sampling values; and a digital processing circuit, a control input of the digital processing circuit being connected to the overdrive output, the digital processing circuit influencing a reproduction volume as a function of the overdrive signal, the digital processing circuit including a control system, the control system including a device, wherein in response to a presence of the overdrive signal and for each sampling value of the audio signal, the device decreases the reproduction volume of the audio signal by a first predefined value simultaneously with an increase in a counter content of a counter by a second predefined value, and wherein, in an absence of the overdrive signal and for each sampling value of the audio signal, the device increases the reproduction volume by a fourth predefined value when the counter content is equal to zero and the reproduction volume is less than a preset value and the counter content of the counter decreases by a third predefined value when the counter content is greater than zero, the audio signal being digital.

7. The arrangement according to claim 6, further comprising:
   a switch for switching off an automatic volume control, the switch selectively interrupting a connection between the overdrive output and the control input.

8. The arrangement according to claim 6, further comprising:
   means for implementing an automatic volume control in the digital signal processing circuit.

9. The arrangement according to claim 6, further comprising:
   a memory storing values, the values being accessed as a function of at least one of a selected audio signal source and a type of the audio signal.

* * * * *

UNITED STATES PATENT AND TRADEMARK OFFICE
CERTIFICATE OF CORRECTION

PATENT NO. : 6,782,107 B1
DATED : August 24, 2004
INVENTOR(S) : Peter Gleim

It is certified that error appears in the above-identified patent and that said Letters Patent is hereby corrected as shown below:

Column 1,
Line 19, change "In prospectus" to -- In the prospectus --
Line 59, change "an overdrive conditions" to -- an overdrive condition --

Column 2,
Line 28, change "and, is fed" to -- and is fed --
Line 64, change "The Or output signal" to -- The output signal --

Column 3,
Line 7, change "in FIG. 2 the mode" to -- in FIG. 2. The mode --
Line 9, change "is describe in" to -- is described on --
Lines 32-33, change "is checked for the, presence" to -- is checked for the presence --
Line 34, change "overdrive, condition" to -- overdrive condition --
Line 66, change "invention at the mode" to -- invention and the mode --

Column 4,
Lines 47-48, change "and are connected to" to -- and to --

Column 5,
Line 12, change "and which indicated" to -- and indicates --

Signed and Sealed this

Twenty-first Day of June, 2005

JON W. DUDAS
*Director of the United States Patent and Trademark Office*